US012791365B2

(12) United States Patent
Hong et al.

(10) Patent No.: US 12,791,365 B2
(45) Date of Patent: Nov. 10, 2026

(54) WATERPROOF SENSOR HAVING A GROUP-CONTROLLED DIP SWITCH

(71) Applicant: Xiamen PVTECH Co., Ltd., Xiamen (CN)

(72) Inventors: Haibo Hong, Xiamen (CN); Fuxing Lu, Xiamen (CN)

(73) Assignee: Xiamen PVTECH Co., Ltd., Xiamen (CN)

( * ) Notice: Subject to any disclaimer, the term of this patent is extended or adjusted under 35 U.S.C. 154(b) by 287 days.

(21) Appl. No.: 18/633,551

(22) Filed: Apr. 12, 2024

(65) Prior Publication Data

US 2025/0044131 A1 Feb. 6, 2025

(30) Foreign Application Priority Data

Aug. 3, 2023 (CN) ......................... 202310973032.9

(51) Int. Cl.

*G01D 11/26* (2006.01)
*G01D 11/24* (2006.01)
*H05K 5/00* (2006.01)

(52) U.S. Cl.

CPC ........... *G01D 11/26* (2013.01); *G01D 11/245* (2013.01); *H05K 5/0056* (2013.01); *H05K 5/0069* (2013.01)

(58) Field of Classification Search

CPC ........ G01D 11/26; G01D 11/245; G01D 5/12; H05K 5/0056; H05K 5/0069; H01H 9/04; H01H 13/06; H04W 4/38

See application file for complete search history.

(56) References Cited

U.S. PATENT DOCUMENTS 4,652,706 A * 3/1987 Rao ........................ H01H 13/02 74/100.2
4,918,270 A * 4/1990 Orrico .................... H01H 13/28 200/345
5,508,484 A 4/1996 Chen
5,962,827 A * 10/1999 Zdanys, Jr. .......... H01H 15/005 200/16 R
7,504,919 B1 * 3/2009 Tittle ..................... H01H 13/06 335/207

(Continued)

FOREIGN PATENT DOCUMENTS

CN 2492999 Y 5/2002
CN 209589125 U 11/2019

(Continued)

*Primary Examiner* — Francis C Gray
(74) *Attorney, Agent, or Firm* — BruceStone LLP; Joseph A. Bruce

(57) ABSTRACT

A waterproof sensor having a group-controlled dip switch includes a housing, an upper cover, a first circuit board, a dip switch, a plurality of metal pins and a switch hole sealing pad. The housing has an upper opening, a lower opening and a switch hole. The upper cover is disposed on the upper opening to cover the upper opening. The first circuit board is disposed inside the housing. The dip switch is disposed on the first circuit board and corresponding to the switch hole. A plurality of metal pins is disposed at the lower opening and electrically connected to the first circuit board. The switch hole sealing pad is disposed on the switch hole to cover the switch hole.

8 Claims, 10 Drawing Sheets

(56) References Cited

U.S. PATENT DOCUMENTS

| | | | | |
|---|---|---|---|---|
| 2012/0325629 A1* | 12/2012 | Li | H01H 35/02 200/61.52 |
| 2013/0001053 A1* | 1/2013 | Li | H01H 35/02 200/61.52 |
| 2022/0102089 A1* | 3/2022 | Jimenez Pavon | H01H 13/14 |

FOREIGN PATENT DOCUMENTS

| | | | |
|---|---|---|---|
| CN | 110646131 | A | 1/2020 |
| CN | 211262263 | U | 8/2020 |
| CN | 211315886 | U | 8/2020 |
| CN | 213465087 | U | 6/2021 |
| CN | 219164333 | U | 6/2023 |
| JP | 2012-63328 | A | 3/2012 |
| JP | 2017199470 | A | 11/2017 |

* cited by examiner

WATERPROOF SENSOR HAVING A GROUP-CONTROLLED DIP SWITCH

BACKGROUND OF THE INVENTION

1. Field of the Invention

The present invention relates to a sensor, in particular to a waterproof sensor having a group-controlled dip switch.

2. Description of the Prior Art

In order to meet the requirements of IoT systems and other intelligent systems, the functions of sensors have undergone significant improvements and optimizations. However, currently available sensors lack an effective waterproof structure. Therefore, when sensors are placed in humid environments, the circuit boards of the sensors are prone to damage upon contact with water, rendering the sensors unable to operate properly.

Furthermore, although the currently available sensors are equipped with communication modules such as Bluetooth modules, WiFi modules, ZigBee modules, etc., to provide communication function, these sensors are unable to offer the group-controlled function, imposing significant limitations on their applications.

SUMMARY OF THE INVENTION

One embodiment of the present invention provides a waterproof sensor having a group-controlled dip switch, which includes a housing, an upper cover, a first circuit board, a dip switch, a plurality of metal pins and a switch hole. The housing has an upper opening, a lower opening and a switch hole. The upper cover is disposed on the upper opening to cover the upper opening. The first circuit board is disposed inside the housing. The dip switch is disposed on the first circuit board and corresponding to the switch hole. A plurality of metal pins is disposed at the lower opening and electrically connected to the first circuit board. The switch hole sealing pad is disposed on the switch hole to cover the switch hole.

In one embodiment, the switch hole has a waterproof ring disposed on the side wall of the switch hole, and having a first protruding ring and a second protruding ring. The first protruding ring extends in the direction away from the switch hole to form a first waterproof groove between the first protruding ring and the side wall. The second protruding ring extends in the direction toward the central axis of the switch hole to form a second waterproof groove between the first protruding ring and the second protruding ring.

In one embodiment, the switch hole sealing hole has a first sealing ring embedded in the first waterproof groove and a second sealing ring embedded in the second waterproof groove.

In one embodiment, the switch hole sealing pad further has a waterproof fixing ring disposed at the bottom of the switch hole sealing pad in order to form a first waterproof space and a second waterproof space. The first waterproof space is between the first sealing ring and the second sealing ring. The second waterproof space is between the second sealing ring and the waterproof fixing ring. The first protruding ring is embedded in the first waterproof space and the second protruding ring embedded in the second waterproof space.

In one embodiment, the diameter of the switch holes decreases along a first direction parallel to the central axis of the switch hole and facing the central point of the housing.

In one embodiment, the waterproof sensor further includes an upper cover sealing pad disposed between the upper cover and the housing.

In one embodiment, the waterproof sensor further includes a second circuit board disposed on the first circuit board.

In one embodiment, the second circuit board is a Bluetooth module, a WiFi module, a ZigBee module or other similar components.

In one embodiment, the upper cover is made of a transparent material or a translucent material.

In one embodiment, the number of metal pins is two or more.

The waterproof sensor having a group-controlled dip switch in accordance with the embodiments of the present invention may have the following advantages:

(1) In one embodiment of the present invention, a waterproof sensor comprises a housing, an upper cover, a first circuit board, a dip switch, a plurality of metal pins, and a switch hole sealing pad. The housing has an upper opening, a lower opening, and a switch hole. The upper cover is disposed on the upper opening to cover the upper opening. The first circuit board is disposed inside the housing. The dip switch is disposed on the first circuit board and corresponds to the switch hole. The metal pins are disposed at the lower opening and electrically connected to the first circuit board. The switch hole sealing pad is disposed on the switch hole to cover the switch hole. As described above, the waterproof sensor has a dip switch, which can provide the group-controlled function in order to meet the requirements of different applications.

(2) In one embodiment of the present invention, the switch hole of the housing of the waterproof sensor has a waterproof ring on the side wall of the switch hole. The waterproof ring has a first protruding ring and a second protruding ring. The first protruding ring extends in the direction away from the switch holes to form a first waterproof groove between the first protruding ring and the side wall of the switch hole. The second protruding ring extends in the direction toward the central axis of the switch hole to form a second waterproof groove between the first and second protruding rings. Additionally, the switch hole sealing pad of the waterproof sensor has a first sealing ring and a second sealing ring. The first sealing ring is embedded in the first waterproof groove and the second sealing ring is embedded in the second waterproof groove. The waterproof sensor has the waterproof ring so as to provide two waterproof grooves, and the switch hole sealing pad has two corresponding sealing rings, such that the switch hole sealing pad can be engaged with the waterproof ring in order to provide a double-layer waterproof structure (a first waterproof layer and a second waterproof layer). This structural design significantly enhances the waterproof function of the waterproof sensor, so the waterproof sensor can operate normally for a long time in humid environments.

(3) In one embodiment of the present invention, the switch hole sealing pad of the waterproof sensor also includes a waterproof fixing ring. The waterproof fixing ring is disposed at the bottom of the switch hole sealing pad to form a first waterproof space between the first sealing ring and the second sealing ring. The second sealing ring and the waterproof fixing ring form a second waterproof space. The first protruding ring is embedded in the first waterproof space, and the second protruding ring is embedded in the second waterproof space. Thus, the switch hole sealing pad can additionally provide two waterproof spaces to reinforce the waterproof structure so as to form a double-layer waterproof structure (a third waterproof layer and a fourth waterproof layer). Additionally, the waterproof fixing ring can serve as a bottom sealing structure. This structural design further enhances the waterproof function of the waterproof sensor, so the waterproof sensor can operate normally for a long time in humid environments.

(4) In one embodiment of the present invention, the diameter of the switch hole of the housing of the waterproof sensor decreases along a first direction parallel to the central axis of the switch hole and facing the central point of the housing. In other words, the side wall of the switch hole is inclined. This structural design prevents water from easily entering the interior of the housing, which can effectively prevent damage to the waterproof sensor. Therefore, the reliability of the waterproof sensor can be significantly improved with a view to meeting actual requirements.

(5) In one embodiment of the present invention, the waterproof sensor also includes an upper cover sealing pad. The upper cover sealing pad is disposed between the upper cover and the housing. The upper cover sealing pad effectively enhances the waterproof effect between the upper cover and the housing. This structural design further strengthens the waterproof function of the waterproof sensor, such that the waterproof sensor can operate normally for a long time in humid environments.

(6) In one embodiment of the present invention, the waterproof sensor also includes a second circuit board, which can be a Bluetooth module, a WiFi module, a ZigBee module, or other similar components. Therefore, the waterproof sensor can not only provide the group-controlled function, but also offer other intelligent features. Consequently, the waterproof sensor can be more flexible in use.

Further scope of applicability of the present application will become more apparent from the detailed description given hereinafter. However, it should be understood that the detailed description and specific examples, while indicating exemplary embodiments of the present invention, are given by way of illustration only, since various changes and modifications within the spirit and scope of the present invention will become apparent to those skilled in the art from this detailed description.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention will become more fully understood from the detailed description given herein below and the accompanying drawings which are given by way of illustration only, and thus are not limitative of the present invention and wherein.

DETAILED DESCRIPTION

Figure 1:
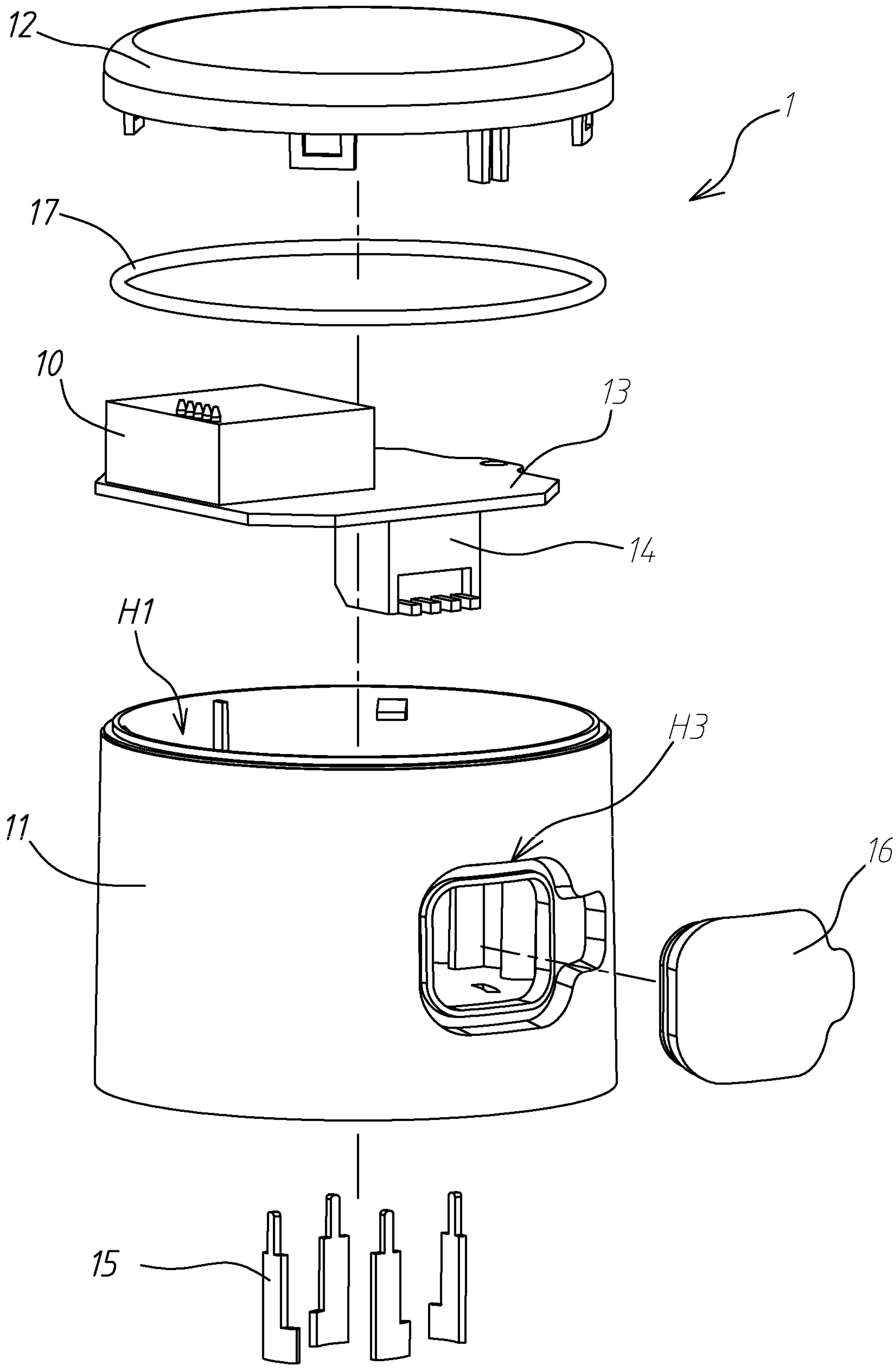
FIG. 1 is an exploded view of a waterproof sensor having a group-controlled dip switch in according with one embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. It should be understood that, when it is described that an element is "coupled" or "connected" to another element, the element may be "directly coupled" or "directly connected" to the other element or "coupled" or "connected" to the other element through a third element. In contrast, it should be understood that, when it is described that an element is "directly coupled" or "directly connected" to another element, there are no intervening elements.

Figure 2:
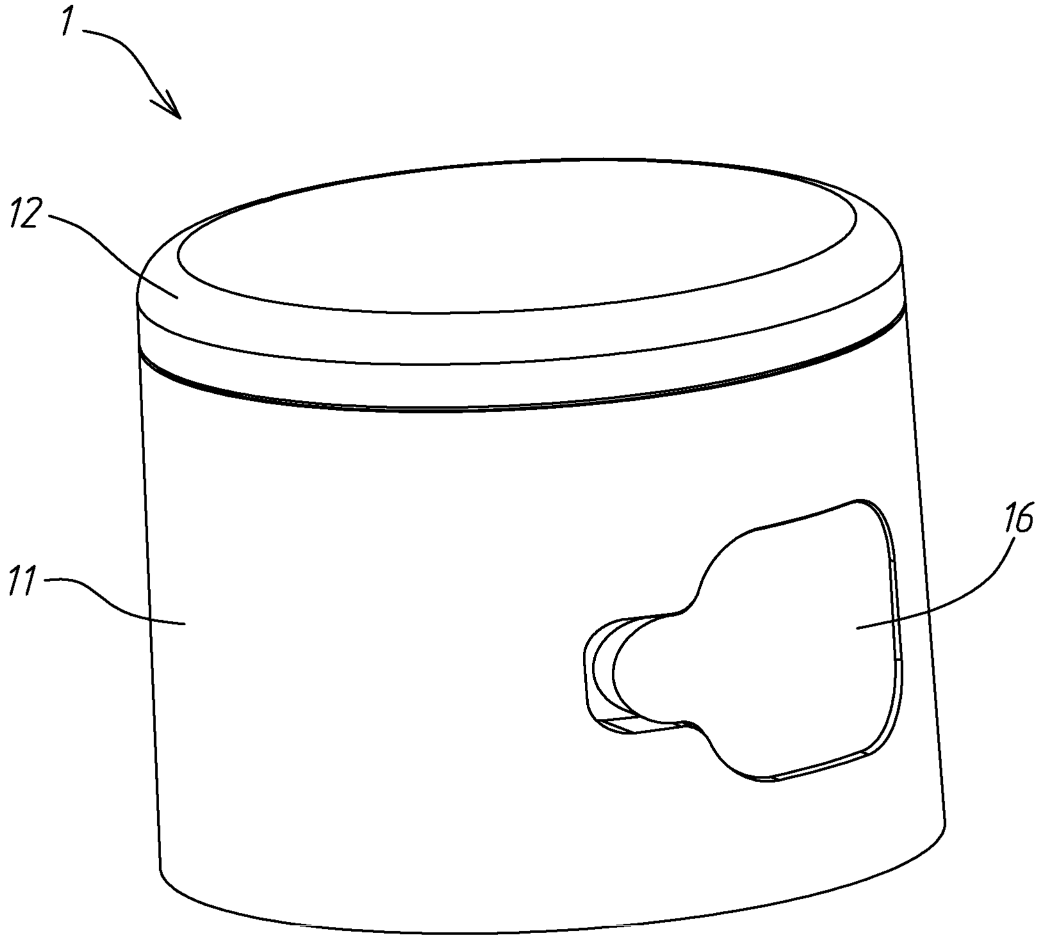
FIG. 2 is a perspective view of the waterproof sensor having the group-controlled dip switch in according with one embodiment of the present invention.
Figure 3:
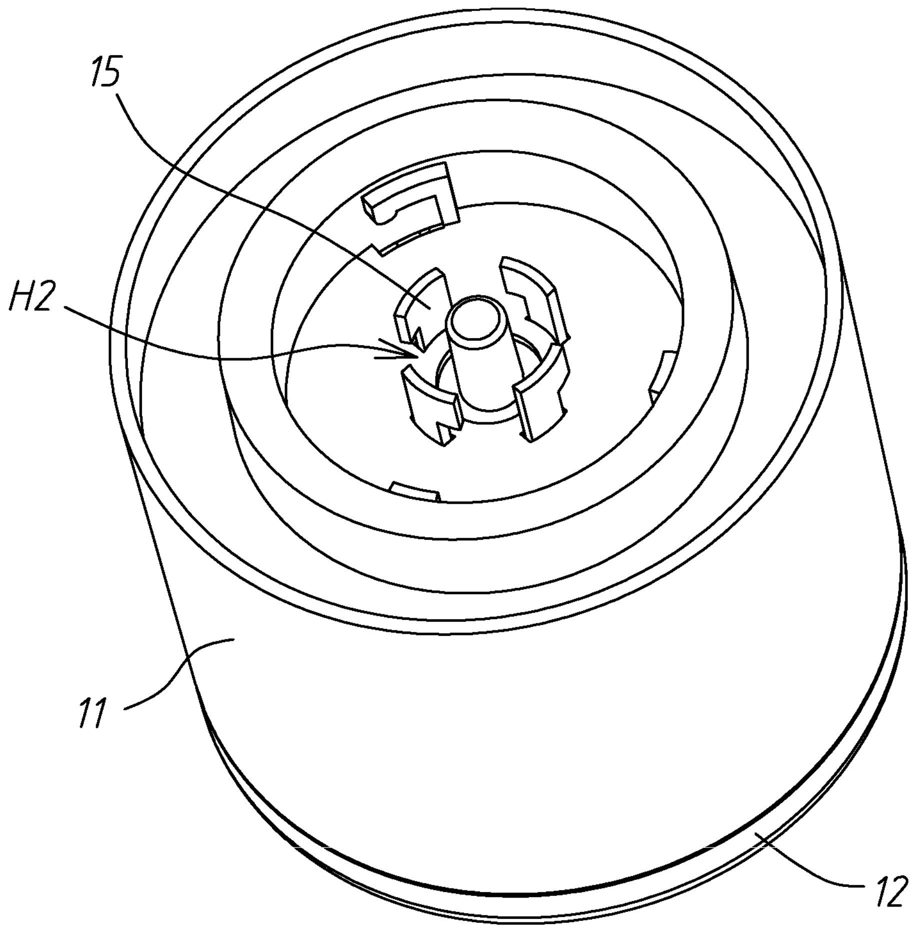
FIG. 3 is a bottom view of the waterproof sensor having the group-controlled dip switch in according with one embodiment of the present invention.

Please refer to FIG. 1, FIG. 2 and FIG. 3, which are an exploded view, a perspective view and a bottom view of a waterproof sensor having a group-controlled dip switch in according with one embodiment of the present invention respectively. As shown in FIG. 1, FIG. 2 and FIG. 3, the waterproof sensor 1 includes a housing 11, an upper cover 12, a first circuit board 13, a dip switch 14, a plurality of metal pins 15, a switch hole sealing pad 16, an upper cover sealing pad 17, and a power module 10.

The housing 11 has an upper opening H1, a lower opening H2, and a switch hole H3. The housing 11 can be cylindrical, and the shape thereof may vary according to actual requirements. In one embodiment, the housing 11 can be made of metal or plastic.

The upper cover 12 is disposed on the upper opening H1 to cover the upper opening H1. In one embodiment, the upper cover is made of a transparent material or a semi-transparent material, such as glass or plastics.

The upper cover sealing pad 17 is disposed between the upper cover 12 and the housing 11. The upper cover sealing pad 17 effectively enhances the waterproof effect between the upper cover 12 and the housing 11 with a view to strengthening the waterproof function of the waterproof sensor 1. In one embodiment, the upper cover sealing pad 17 can be made of silicone, rubber, or other elastic materials.

The first circuit board 13 is disposed inside the housing 11. The power module 10 and other necessary circuit components can be disposed on the upper surface of the first circuit board 13. The first circuit board 13 can be a printed circuit board, a flexible circuit board, or similar components.

The dip switch 14 is disposed on the first circuit board 13, electrically connected to the first circuit board 13, and corresponds to the switch hole H3. In this embodiment, the dip switch 14 can be disposed on the lower surface of the first circuit board 13 to correspond to the switch hole H3.

The metal pins 15 are disposed at the lower opening H2 and electrically connected to the first circuit board 13 (and electronic components on the first circuit board 13, such as the power module 10). In one embodiment, the material of the metal pins 15 can be copper, aluminum, or other metal materials. In another embodiment, the surface of the metal pins 15 may have a metal coating (such as nickel). In one embodiment, the number of metal pins 15 is two or more (in this embodiment, the number of metal pins 15 is four).

The switch hole sealing pad 16 is disposed on the switch hole H3 to cover switch hole H3. In one embodiment, the switch hole sealing pad 16 can be made of silicone, rubber, or other elastic materials.

The embodiment just exemplifies the present invention and is not intended to limit the scope of the present invention; any equivalent modification and variation according to the spirit of the present invention is to be also included within the scope of the following claims and their equivalents.

Figure 4:
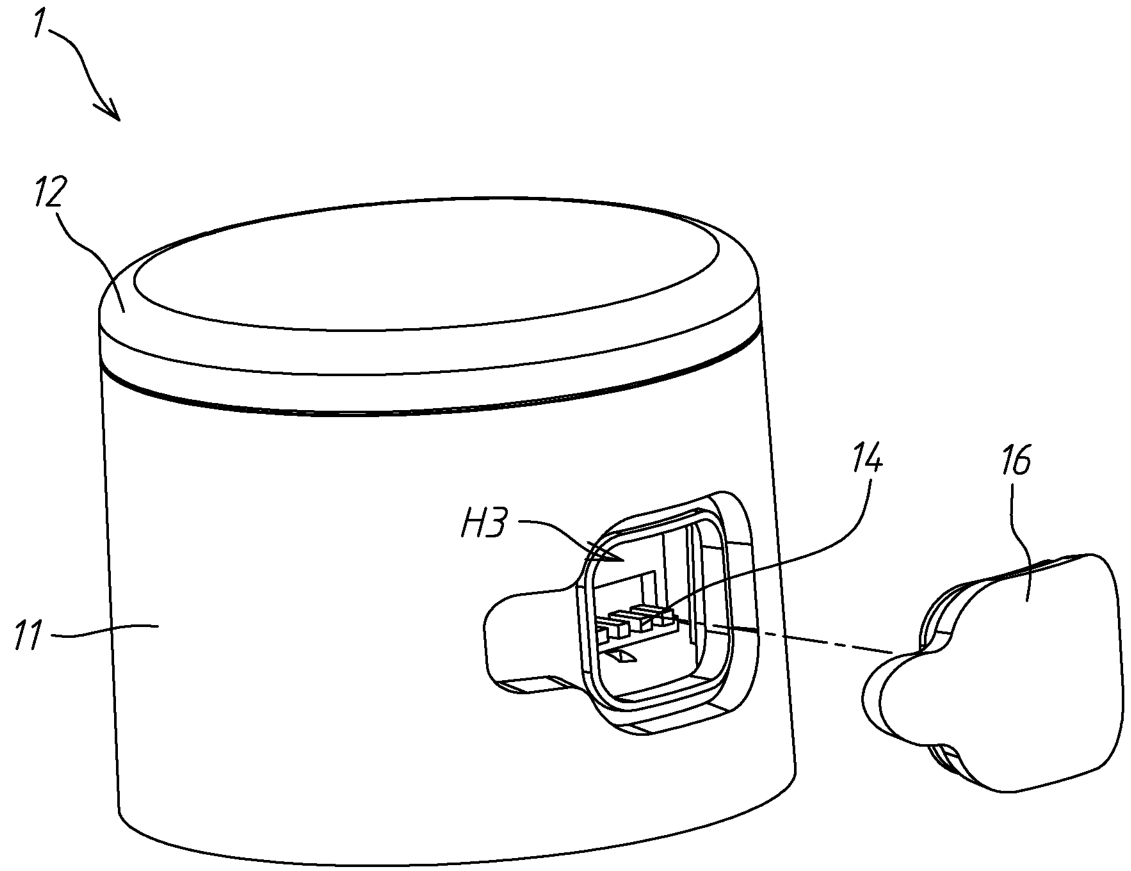
FIG. 4 is a schematic view of the waterproof sensor having the group-controlled dip switch in according with one embodiment of the present invention.

Refer to FIG. 4, which is a schematic view of the waterproof sensor having the group-controlled dip switch in according with one embodiment of the present invention. As shown in FIG. 4, the user can remove the switch hole sealing pad 16 to expose the dip switch 14 from the switch hole H3. Subsequently, the user can operate the dip switch 14 for settings and execution of the group-controlled function.

As set forth above, the waterproof sensor 1 is provided with a dip switch 14, which can provide the group-controlled function to meet the requirements of different applications. Consequently, the application of the waterproof sensor 1 can be more comprehensive.

The embodiment just exemplifies the present invention and is not intended to limit the scope of the present invention; any equivalent modification and variation according to the spirit of the present invention is to be also included within the scope of the following claims and their equivalents.

Figure 5:
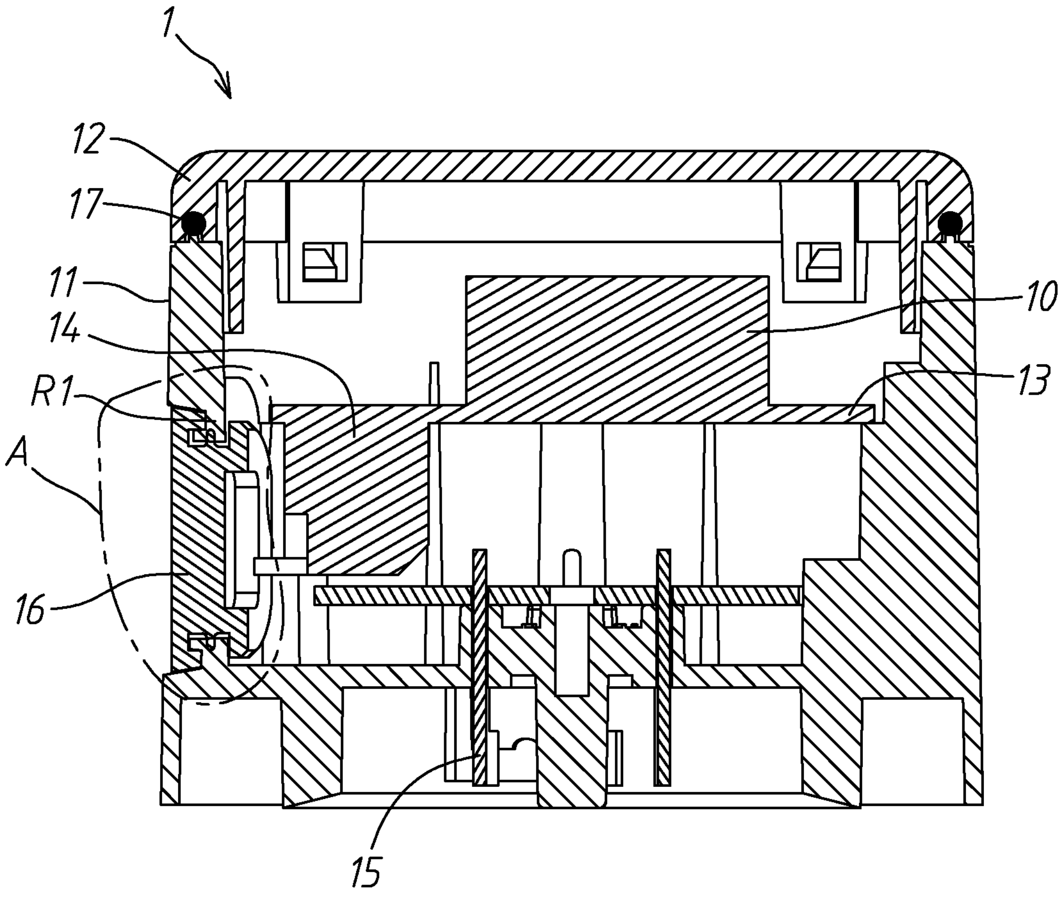
FIG. 5 is a sectional view of the waterproof sensor having the group-controlled dip switch in according with one embodiment of the present invention.
Figure 6:
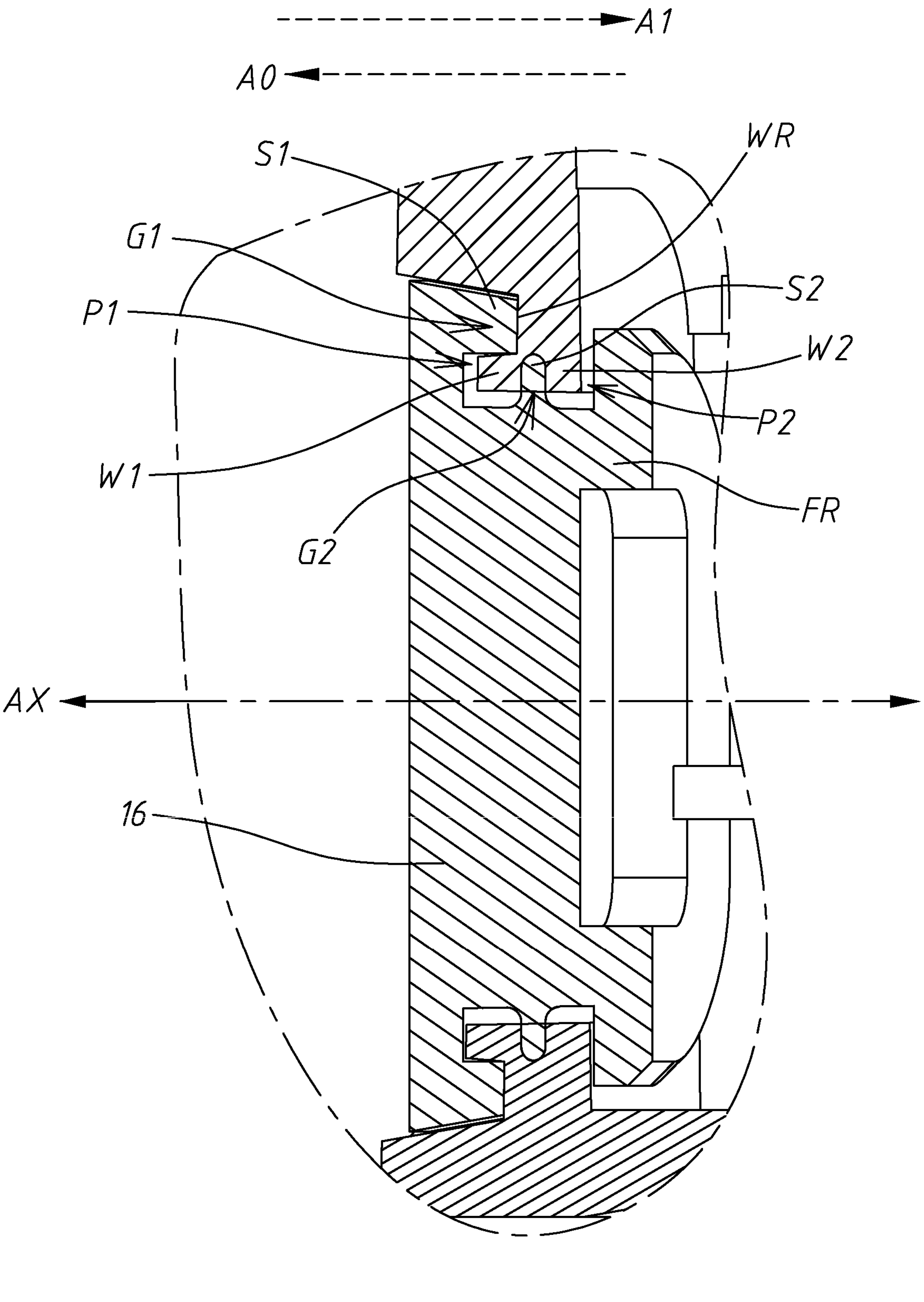
FIG. 6 is a partial enlargement view of the waterproof sensor having the group-controlled dip switch in according with one embodiment of the present invention.

Refer to FIG. 5 and FIG. 6, which FIG. 5 is a sectional view and a partial enlargement view of the waterproof sensor having the group-controlled dip switch in according with one embodiment of the present invention respectively. FIG. 6 shows the enlarged view of the marked area A in FIG. 5. As shown in FIG. 5 and FIG. 6, the switch hole H3 has a waterproof ring WR on the side wall of the switch hole H3. The waterproof ring WR has a first protruding ring W1 and a second protruding ring W2. The first protruding ring W1 extends in the direction away from the switch hole H3 to form a first waterproof groove G1 between the first protruding ring W1 and the side wall of the switch hole H3. The second protruding ring W2 extends in the direction toward the central axis AX of the switch hole H3 to form a second waterproof groove G2 between the first and second protruding rings W1 and W2.

The switch hole sealing pad 16 has a first sealing ring S1 and a second sealing ring S2. The first sealing ring S1 is embedded in the first waterproof groove G1, while the second sealing ring S2 is embedded in the second waterproof groove G2.

Through this structure, the switch hole sealing pad 16 can be engaged with the waterproof ring WR in order to provide a double-layer waterproof structure including the first waterproof layer (the first sealing ring S1 embedded in the first waterproof groove G1) and the second waterproof layer (the second sealing ring S2 embedded in the second waterproof groove G2).

Moreover, the switch hole sealing pad 16 further includes a waterproof fixing ring FR. The waterproof fixing ring FR is disposed on the bottom of the switch hole sealing pad 16. This arrangement results in the first sealing ring S1 and the second sealing ring S2 forming the first waterproof space P1. The second waterproof space P2 can be formed between the second sealing ring S2 and the waterproof fixing ring FR. The first protruding ring W1 is embedded in the first waterproof space P1, while the second protruding ring W2 is embedded in the second waterproof space P2. Consequently, the switch hole sealing pad 16 additionally provides two waterproof spaces to enhance the waterproof structure, which can form a third waterproof layer (the first protruding ring W1 embedded in the first waterproof space P1) and a fourth waterproof layer (the second protruding ring W2 embedded in the second waterproof space P2), resulting in a double-layer waterproof structure. Furthermore, the waterproof fixing ring FR can serve as a bottom sealing structure.

As previously stated, the above-mentioned structural design significantly enhances the waterproof function of the waterproof sensor 1, such that the waterproof sensor 1 can operate reliably for a long time even in humid environments.

Additionally, the diameter of the switch hole H3 of the housing 11 of the waterproof sensor 1 decreases along a first direction (as indicated by the arrow A1 in FIG. 6). The first direction is parallel to the central axis AX of the switch hole H3 and faces the central point of the housing 11. In other words, the side wall of the switch hole H3 is inclined. This design makes it difficult for water to enter the interior of the housing 11, effectively preventing damage to the waterproof sensor 1. Consequently, the reliability of the waterproof sensor 1 is greatly improved, so the waterproof sensor 1 can meet actual requirements.

The embodiment just exemplifies the present invention and is not intended to limit the scope of the present invention; any equivalent modification and variation according to the spirit of the present invention is to be also included within the scope of the following claims and their equivalents.

It is worthy to point out that currently available sensors lack an effective waterproof structure. Therefore, when sensors are placed in humid environments, the circuit boards of the sensors are prone to damage upon contact with water, rendering the sensors unable to operate properly. Besides, although the currently available sensors are equipped with communication modules such as Bluetooth modules, WiFi modules, ZigBee modules, etc., to provide communication function, these sensors are unable to offer the group-controlled function, imposing significant limitations on their applications. By contrast, according to one embodiment of the present invention, a waterproof sensor comprises a housing, an upper cover, a first circuit board, a dip switch, a plurality of metal pins, and a switch hole sealing pad. The housing has an upper opening, a lower opening, and a switch hole. The upper cover is disposed on the upper opening to cover the upper opening. The first circuit board is disposed inside the housing. The dip switch is disposed on the first circuit board and corresponds to the switch hole. The metal pins are disposed at the lower opening and electrically connected to the first circuit board. The switch hole sealing pad is disposed on the switch hole to cover the switch hole. As described above, the waterproof sensor has a dip switch, which can provide the group-controlled function in order to meet the requirements of different applications.

According to one embodiment of the present invention, the switch hole of the housing of the waterproof sensor has a waterproof ring on the side wall of the switch hole. The waterproof ring has a first protruding ring and a second protruding ring. The first protruding ring extends in the direction away from the switch holes to form a first waterproof groove between the first protruding ring and the side wall of the switch hole. The second protruding ring extends in the direction toward the central axis of the switch hole to form a second waterproof groove between the first and second protruding rings. Additionally, the switch hole sealing pad of the waterproof sensor has a first sealing ring and a second sealing ring. The first sealing ring is embedded in the first waterproof groove and the second sealing ring is embedded in the second waterproof groove. The waterproof sensor has the waterproof ring so as to provide two waterproof grooves, and the switch hole sealing pad has two corresponding sealing rings, such that the switch hole sealing pad can be engaged with the waterproof ring in order to provide a double-layer waterproof structure (a first waterproof layer and a second waterproof layer). This structural design significantly enhances the waterproof function of the waterproof sensor, so the waterproof sensor can operate normally for a long time in humid environments.

Also, according to one embodiment of the present invention, the switch hole sealing pad of the waterproof sensor also includes a waterproof fixing ring. The waterproof fixing ring is disposed at the bottom of the switch hole sealing pad to form a first waterproof space between the first sealing ring and the second sealing ring. The second sealing ring and the waterproof fixing ring form a second waterproof space. The first protruding ring is embedded in the first waterproof space, and the second protruding ring is embedded in the second waterproof space. Thus, the switch hole sealing pad can additionally provide two waterproof spaces to reinforce the waterproof structure so as to form a double-layer waterproof structure (a third waterproof layer and a fourth waterproof layer). Additionally, the waterproof fixing ring can serve as a bottom sealing structure. This structural design further enhances the waterproof function of the waterproof sensor, so the waterproof sensor can operate normally for a long time in humid environments.

Further, according to one embodiment of the present invention, the diameter of the switch hole of the housing of the waterproof sensor decreases along a first direction parallel to the central axis of the switch hole and facing the central point of the housing. In other words, the side wall of the switch hole is inclined. This structural design prevents water from easily entering the interior of the housing, which can effectively prevent damage to the waterproof sensor. Therefore, the reliability of the waterproof sensor can be significantly improved with a view to meeting actual requirements.

Moreover, according to one embodiment of the present invention, the waterproof sensor also includes an upper cover sealing pad. The upper cover sealing pad is disposed between the upper cover and the housing. The upper cover sealing pad effectively enhances the waterproof effect between the upper cover and the housing. This structural design further strengthens the waterproof function of the waterproof sensor, such that the waterproof sensor can operate normally for a long time in humid environments.

Furthermore, according to one embodiment of the present invention, the waterproof sensor also includes a second circuit board, which can be a Bluetooth module, a WiFi module, a ZigBee module, or other similar components. Therefore, the waterproof sensor can not only provide the group-controlled function, but also offer other intelligent features. Consequently, the waterproof sensor can be more flexible in use. Thus, the waterproof sensor according to the embodiments of the present invention can definitely achieve great technical effects.

Figure 7:
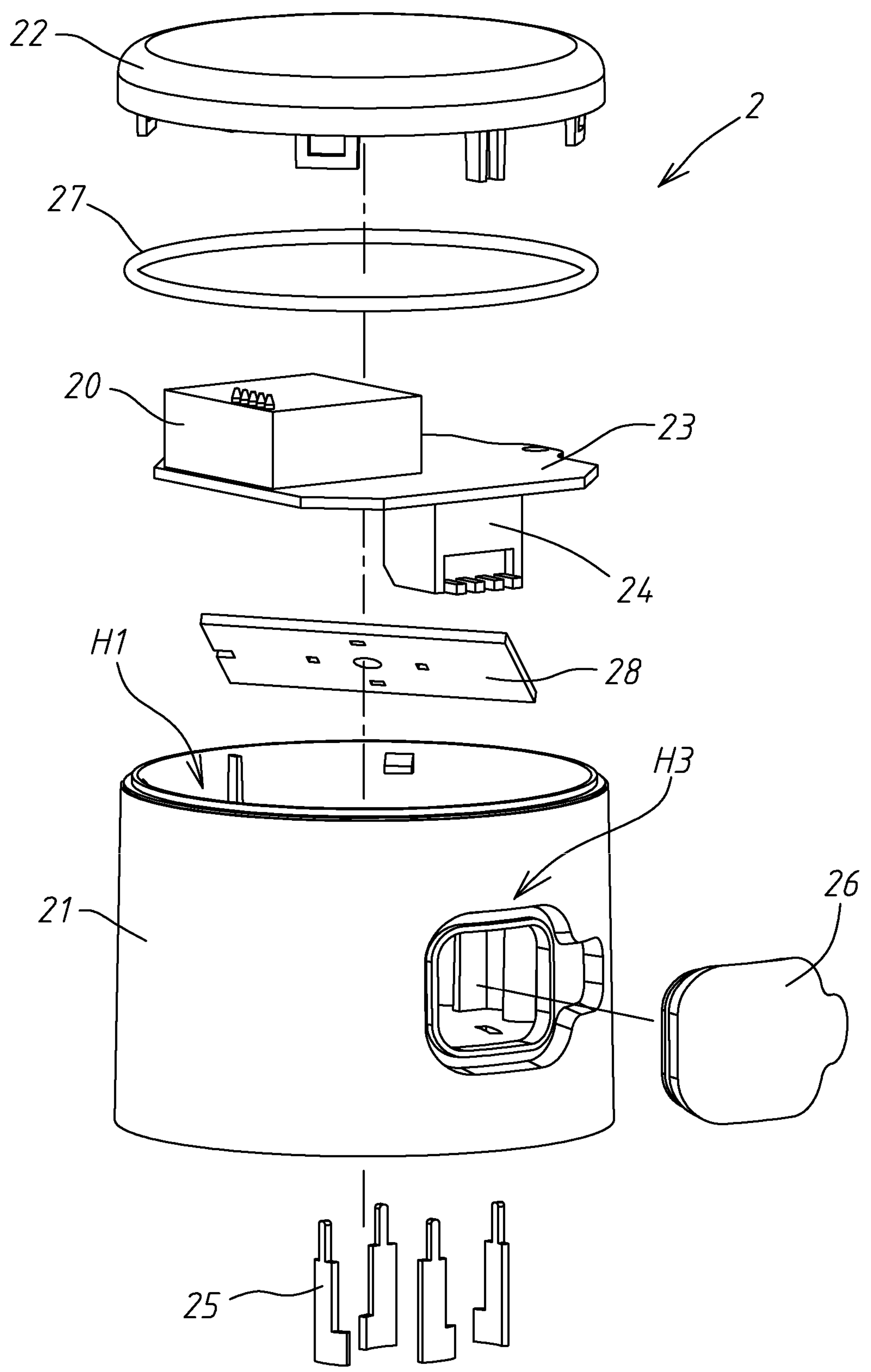
FIG. 7 is an exploded view of a waterproof sensor having a group-controlled dip switch in according with another embodiment of the present invention.
Figure 8:
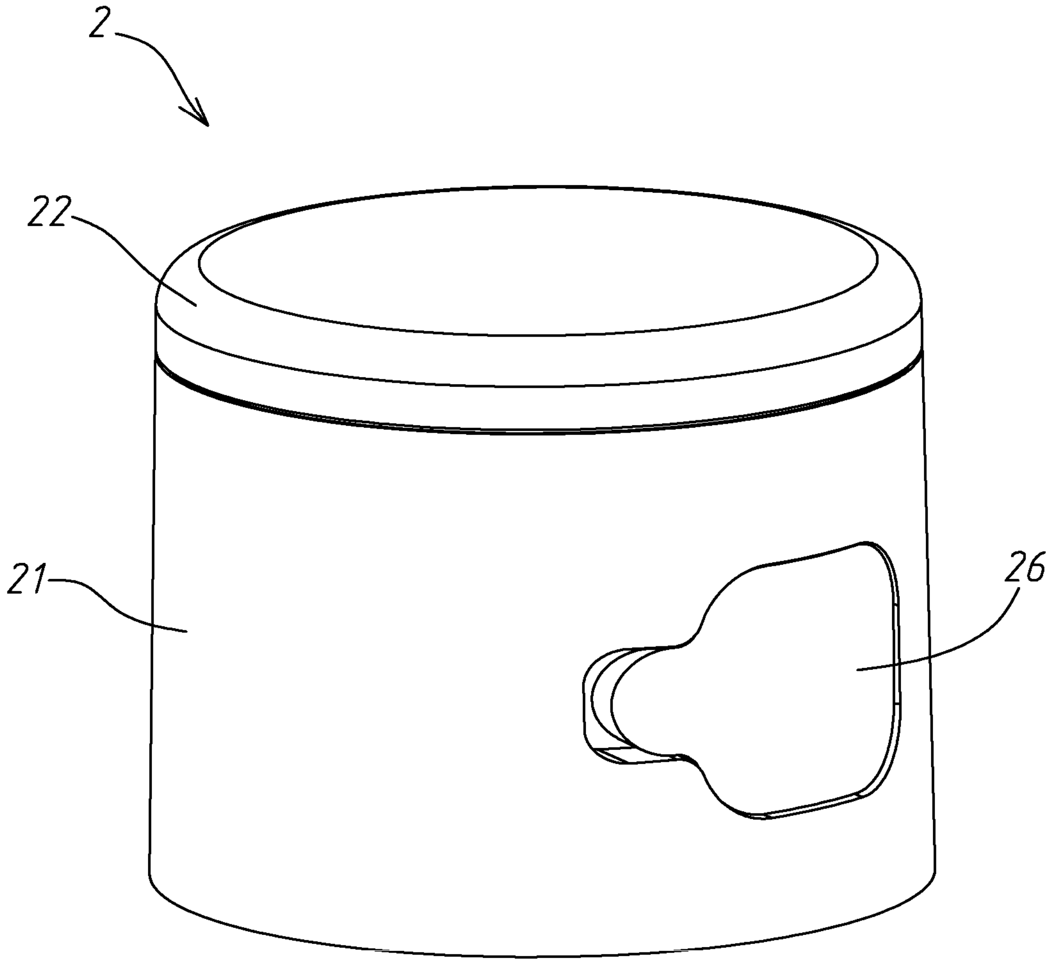
FIG. 8 is a perspective view of the waterproof sensor having the group-controlled dip switch in according with another embodiment of the present invention.
Figure 9:
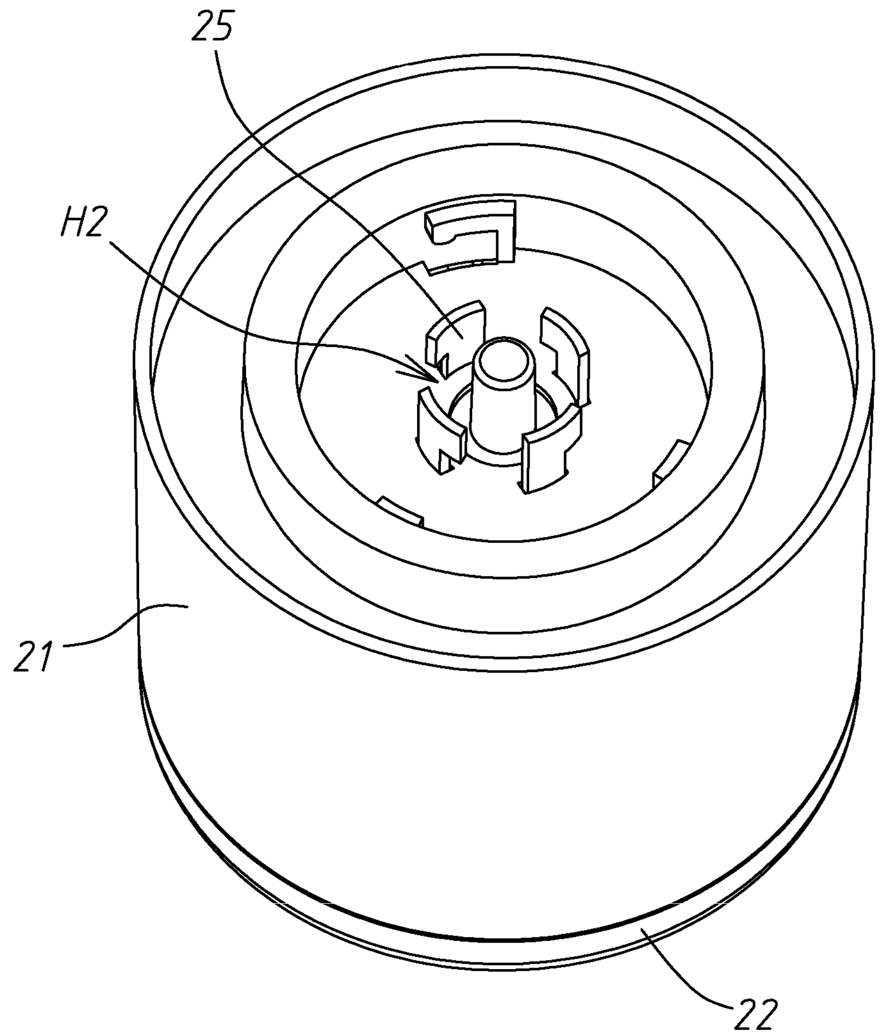
FIG. 9 is a bottom view of the waterproof sensor having the group-controlled dip switch in according with another embodiment of the present invention.

Please refer to FIG. 7, FIG. 8 and FIG. 9, which are an exploded view, a perspective view and a bottom view of a waterproof sensor having a group-controlled dip switch in according with another embodiment of the present invention. As shown in FIG. 7, FIG. 8 and FIG. 9, the waterproof sensor 2 includes a housing 21, an upper cover 22, a first circuit board 23, a dip switch 24, a plurality of metal pins 25, a switch hole sealing pad 26, an upper cover sealing pad 27, and a power module 20.

The housing 21 has an upper opening H1, a lower opening H2, and a switch hole H3. The upper cover 22 is disposed on the upper opening H1 to cover the upper opening H1. The upper cover sealing pad 27 is disposed between the upper cover 22 and the housing 21. The first circuit board 23 is disposed inside the housing 21. The power module 20 and other necessary circuit components can be disposed on the upper surface of the first circuit board 23. The dip switch 24 is disposed on the first circuit board 23 and corresponds to the switch hole H3. In this embodiment, the dip switch 24 can be disposed on the lower surface of the first circuit board 23. The metal pins 25 are disposed at the lower opening H2 and electrically connected to the first circuit board 23 (and electronic components, such as the power module 20, on the first circuit board 23). The switch hole sealing pad 26 is disposed on the switch hole H3 to cover the switch hole H3.

The above elements are similar to those of the previous embodiment, so will not be described herein again. The difference between this embodiment and the previous embodiment is that the waterproof sensor 2 of this embodiment additionally includes a second circuit board 28.

Figure 10:
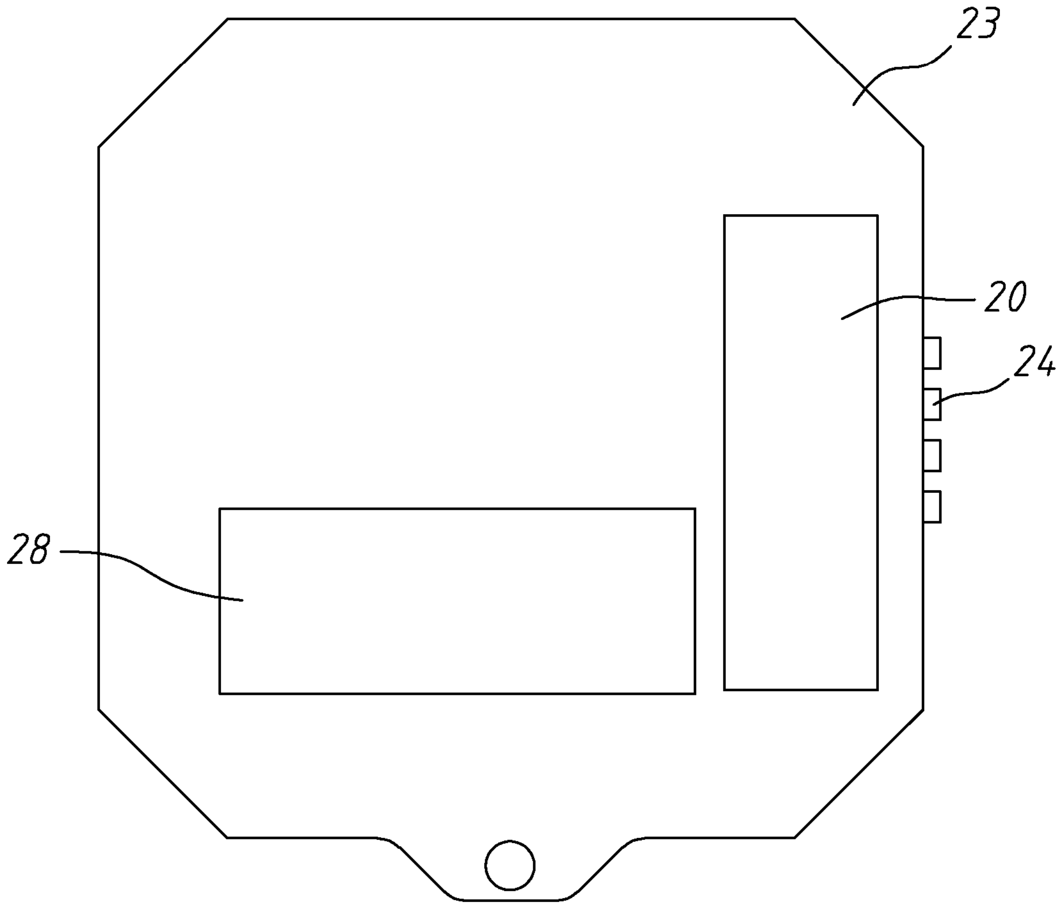
FIG. 10 is a bottom view of a first circuit board of the waterproof sensor having the group-controlled dip switch in according with another embodiment of the present invention.

Please refer to FIG. 10, which is a bottom view of a first circuit board of the waterproof sensor having the group-controlled dip switch in according with another embodiment of the present invention. As shown in FIG. 10, the second circuit board 28 can be disposed on the lower surface of the first circuit board 23. In this embodiment, the second circuit board 28 is a Bluetooth module. In another embodiment, the second circuit board 28 can also be a WiFi module, ZigBee module, or other similar components.

Since the waterproof sensor 2 has the second circuit board 28, so the waterproof sensor 2 not only provides the group-controlled function but also offers other intelligent functions. Therefore, the waterproof sensor 2 can be more flexible in use.

The embodiment just exemplifies the present invention and is not intended to limit the scope of the present invention; any equivalent modification and variation according to the spirit of the present invention is to be also included within the scope of the following claims and their equivalents.

To sum up, according to one embodiment of the present invention, a waterproof sensor comprises a housing, an upper cover, a first circuit board, a dip switch, a plurality of metal pins, and a switch hole sealing pad. The housing has an upper opening, a lower opening, and a switch hole. The upper cover is disposed on the upper opening to cover the upper opening. The first circuit board is disposed inside the housing. The dip switch is disposed on the first circuit board and corresponds to the switch hole. The metal pins are disposed at the lower opening and electrically connected to the first circuit board. The switch hole sealing pad is disposed on the switch hole to cover the switch hole. As described above, the waterproof sensor has a dip switch, which can provide the group-controlled function in order to meet the requirements of different applications.

According to one embodiment of the present invention, the switch hole of the housing of the waterproof sensor has a waterproof ring on the side wall of the switch hole. The waterproof ring has a first protruding ring and a second protruding ring. The first protruding ring extends in the direction away from the switch holes to form a first waterproof groove between the first protruding ring and the side wall of the switch hole. The second protruding ring extends in the direction toward the central axis of the switch hole to form a second waterproof groove between the first and second protruding rings. Additionally, the switch hole sealing pad of the waterproof sensor has a first sealing ring and a second sealing ring. The first sealing ring is embedded in the first waterproof groove and the second sealing ring is embedded in the second waterproof groove. The waterproof sensor has the waterproof ring so as to provide two waterproof grooves, and the switch hole sealing pad has two corresponding sealing rings, such that the switch hole sealing pad can be engaged with the waterproof ring in order to provide a double-layer waterproof structure (a first waterproof layer and a second waterproof layer). This structural design significantly enhances the waterproof function of the waterproof sensor, so the waterproof sensor can operate normally for a long time in humid environments.

Also, according to one embodiment of the present invention, the switch hole sealing pad of the waterproof sensor also includes a waterproof fixing ring. The waterproof fixing ring is disposed at the bottom of the switch hole sealing pad to form a first waterproof space between the first sealing ring and the second sealing ring. The second sealing ring and the waterproof fixing ring form a second waterproof space. The first protruding ring is embedded in the first waterproof space, and the second protruding ring is embedded in the second waterproof space. Thus, the switch hole sealing pad can additionally provide two waterproof spaces to reinforce the waterproof structure so as to form a double-layer waterproof structure (a third waterproof layer and a fourth waterproof layer). Additionally, the waterproof fixing ring can serve as a bottom sealing structure. This structural design further enhances the waterproof function of the waterproof sensor, so the waterproof sensor can operate normally for a long time in humid environments.

Further, according to one embodiment of the present invention, the diameter of the switch hole of the housing of the waterproof sensor decreases along a first direction parallel to the central axis of the switch hole and facing the central point of the housing. In other words, the side wall of the switch hole is inclined. This structural design prevents water from easily entering the interior of the housing, which can effectively prevent damage to the waterproof sensor. Therefore, the reliability of the waterproof sensor can be significantly improved with a view to meeting actual requirements.

Moreover, according to one embodiment of the present invention, the waterproof sensor also includes an upper cover sealing pad. The upper cover sealing pad is disposed between the upper cover and the housing. The upper cover sealing pad effectively enhances the waterproof effect between the upper cover and the housing. This structural design further strengthens the waterproof function of the waterproof sensor, such that the waterproof sensor can operate normally for a long time in humid environments.

Furthermore, according to one embodiment of the present invention, the waterproof sensor also includes a second circuit board, which can be a Bluetooth module, a WiFi module, a ZigBee module, or other similar components. Therefore, the waterproof sensor can not only provide the group-controlled function, but also offer other intelligent features. Consequently, the waterproof sensor can be more flexible in use.

It will be apparent to those skilled in the art that various modifications and variations can be made to the disclosed embodiments. It is intended that the specification and examples be considered as exemplary only, with a true scope of the present invention being indicated by the following claims and their equivalents.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A waterproof sensor having a group-controlled dip switch, comprising:

a housing having an upper opening, a lower opening and a switch hole;

an upper cover disposed on the upper opening to cover the upper opening;

a first circuit board disposed inside the housing;

a dip switch disposed on the first circuit board and corresponding to the switch hole;

a plurality of metal pins disposed at the lower opening and electrically connected to the first circuit board; and a switch hole sealing pad disposed on the switch hole to cover the switch hole;

wherein the switch hole has a waterproof ring disposed on a side wall of the switch hole, and having a first protruding ring and a second protruding ring, wherein the first protruding ring extends in a direction away from the switch hole to form a first waterproof groove between the first protruding ring and the side wall, and the second protruding ring extends in a direction toward a central axis of the switch hole to form a second waterproof groove between the first protruding ring and the second protruding ring.

2. The waterproof sensor having the group-controlled dip switch as claimed in claim 1, wherein the switch hole sealing hole has a first sealing ring embedded in the first waterproof groove and a second sealing ring embedded in the second waterproof groove.

3. The waterproof sensor having the group-controlled dip switch as claimed in claim 2, wherein the switch hole sealing pad further has a waterproof fixing ring disposed at a bottom of the switch hole sealing pad in order to form a first waterproof space between the first sealing ring and the second sealing ring, and form a second waterproof space between the second sealing ring and the waterproof fixing ring, wherein the first protruding ring is embedded in the first waterproof space and the second protruding ring embedded in the second waterproof space.

4. The waterproof sensor having the group-controlled dip switch as claimed in claim 1, wherein a diameter of the switch holes decreases along a first direction parallel to a central axis of the switch hole and facing a central point of the housing.

5. The waterproof sensor having the group-controlled dip switch as claimed in claim 1, further comprising an upper cover sealing pad disposed between the upper cover and the housing.

6. The waterproof sensor having the group-controlled dip switch as claimed in claim 1, further comprising a second circuit board disposed on the first circuit board.

7. The waterproof sensor having the group-controlled dip switch as claimed in claim 6, wherein the second circuit board is a Bluetooth module, a WiFi module, or a ZigBee module.

8. The waterproof sensor having the group-controlled dip switch as claimed in claim 1, wherein the upper cover is made of a transparent material.

* * * * *